United States Patent
Lee et al.

(10) Patent No.: US 9,276,172 B2
(45) Date of Patent: Mar. 1, 2016

(54) METHOD OF MANUFACTURING A DISPLAY DEVICE

(71) Applicant: Samsung Display Co., Ltd., Yongin (KR)

(72) Inventors: Jong Hwan Lee, Seoul (KR); Young Bae Kim, Yongin-si (KR); Jong Seong Kim, Seoul (KR); Tae Hwan Kim, Seoul (KR); Myeong Hee Kim, Yongin-si (KR); Woo Jae Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/947,594

(22) Filed: Jul. 22, 2013

(65) Prior Publication Data

US 2014/0106489 A1  Apr. 17, 2014

(30) Foreign Application Priority Data

Oct. 16, 2012 (KR) .................. 10-2012-0115046

(51) Int. Cl.
| | |
|---|---|
| *G02F 1/1333* | (2006.01) |
| *H01L 33/26* | (2010.01) |
| *B32B 17/06* | (2006.01) |
| *H01L 27/12* | (2006.01) |
| *G02F 1/136* | (2006.01) |
| *G02F 1/1337* | (2006.01) |
| *G02F 1/1362* | (2006.01) |

(52) U.S. Cl.
CPC .............. *H01L 33/26* (2013.01); *B32B 17/06* (2013.01); *G02F 1/136* (2013.01); *H01L 27/1266* (2013.01); *G02F 1/13624* (2013.01); *G02F 1/133707* (2013.01); *G02F 2001/13613* (2013.01); *G02F 2202/28* (2013.01)

(58) Field of Classification Search
CPC ............ H01L 21/6831; H01L 27/1266; H01L 29/78606; G02B 6/132; G02F 1/134363; G02F 2001/13613
See application file for complete search history.

(56) References Cited

U.S. PATENT DOCUMENTS

| | | | |
|---|---|---|---|
| 2010/0028656 A1* | 2/2010 | Kim et al. ................... | 428/323 |
| 2010/0221815 A1* | 9/2010 | Abbott et al. .............. | 435/287.1 |
| 2011/0111194 A1* | 5/2011 | Carre et al. .................. | 428/215 |
| 2011/0228189 A1* | 9/2011 | Oh et al. ........................ | 349/43 |
| 2012/0094100 A1 | 4/2012 | Takagi et al. | |
| 2012/0140162 A1 | 6/2012 | Chen | |

* cited by examiner

*Primary Examiner* — Pamela E Perkins
(74) *Attorney, Agent, or Firm* — H.C. Park & Associates, PLC

(57) ABSTRACT

It is provided a method of manufacturing a display device for which the damage caused to the display panel due to processing at high temperatures is reduced. The method of manufacturing a display device includes: preparing a carrier substrate including a surface treated region; laying a mother substrate on the carrier substrate; progressing a process of forming a thin film on the mother substrate; and separating the carrier substrate from the mother substrate by using the surface treated region as an initial separation point. Bonding is formed between the carrier substrate and the mother substrate during forming the thin film over the areas that are not surface treated. The two substrates may be separated by disposing permeating oil on the surface treated region wherefrom oil permeates through the remaining regions by osmotic pressure. This way damage caused to the display panel during thin film processing is reduced.

16 Claims, 7 Drawing Sheets

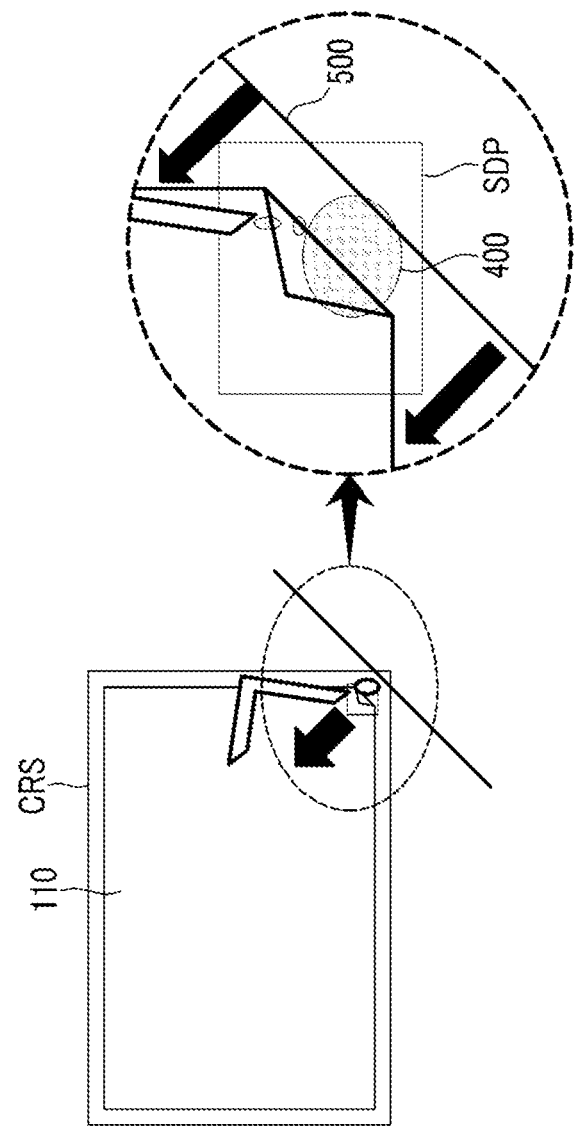

METHOD OF MANUFACTURING A DISPLAY DEVICE

CROSS-REFERENCE TO RELATED APPLICATION

This application claims priority from and the benefit of Korean Patent Application No. 10-2012-0115046 filed in the Korean Intellectual Property Office on Oct. 16, 2012, which is hereby incorporated by reference for all purposes as if fully set forth herein.

BACKGROUND

1. Field

The present invention relates to a method of manufacturing a display device.

2. Discussion of the Background

Various electronic components including a thin film transistor (TFT) are manufactured on a substrate formed of glass, and the like, when a flat panel display, for example, a liquid crystal display device and an organic light emitting display device, is manufactured.

Recently, efforts to reduce a thickness of the substrate on which the aforementioned electronic components, and the like, are formed has been made in order to obtain a technology for manufacturing a thin and light display device.

Recently, substantially thin substrates with a decreased thickness, for example, up to 0.1 mm or smaller, have been manufactured. However, when a thin film process, and the like, is progressed on the thin substrate, the substrate may be damaged due to high temperature processing and the like.

The above information disclosed in this Background section is only for enhancement of understanding of the background of the invention and therefore it may contain information that does not form any part of the prior art.

SUMMARY

Exemplary embodiments of the present invention provide a method of manufacturing a display device having a small thickness by using a carrier substrate.

An exemplary embodiment of the present invention provides a method of manufacturing a display device, including: preparing a carrier substrate including a surface treated region; laying a mother substrate on the carrier substrate; progressing a process of forming a thin film on the mother substrate; and separating the carrier substrate and the mother substrate by using the surface treated region as an initial separation point.

An exemplary embodiment of the present invention provides a method of manufacturing a display device, including: coupling a first substrate and a second substrate together, the first substrate having a first region and a second region outside the first region; forming at least one element on the second substrate; separating the first substrate and the second substrate, the first region being an initial separation point; wherein an adhesive force between the first and second substrates at the first region is less than an adhesive force between the first and second substrates at the second region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 7 is a top plan view schematically illustrating a step of separating the two substrates in the method of manufacturing the display device according to exemplary embodiments of the present invention.

DETAILED DESCRIPTION OF THE EMBODIMENTS

Figure 1:
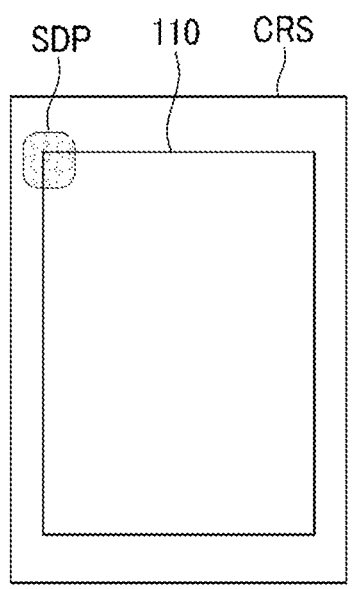
FIG. 1 shows a top plan view illustrating a surface processing region of the method of manufacturing a display device according to an exemplary embodiment of the present invention.
Figure 2:
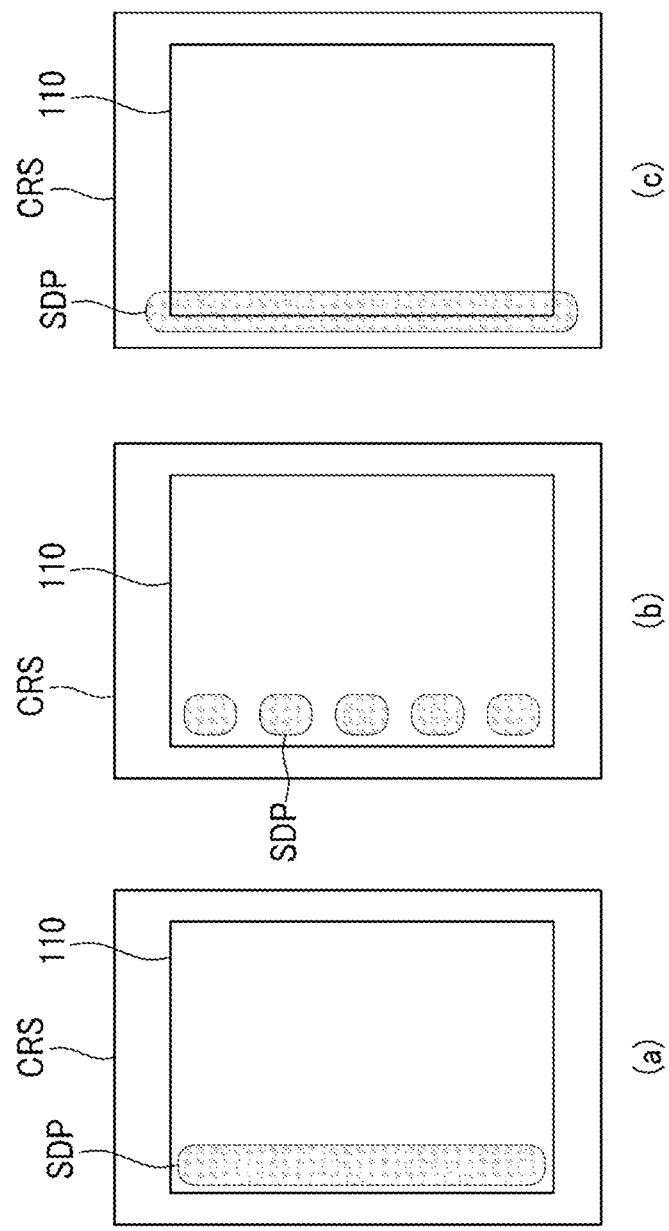
FIG. 2 shows top plan views illustrating a surface processing region of the method for manufacturing a display device according to exemplary embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

In the drawings, the thickness of layers, films, panels, regions, etc., are exaggerated for clarity. Like reference numerals designate like elements throughout the specification.

FIGS. 1 to 7 show top plan views and cross-sectional views for describing a method of manufacturing a display device according to exemplary embodiments of the present invention. FIG. 1 is a top plan view illustrating a surface processing region SDP of the method of manufacturing the display device according to an exemplary embodiment of the present invention.

Referring to FIG. 1, a method of manufacturing a display device according to an exemplary embodiment of the present invention includes a step of performing a surface treatment on a partial region of a carrier substrate CRS. Surface roughness may be increased or surface energy may be adjusted by performing a surface treatment on the partial region of the carrier substrate CRS. The part of the carrier substrate CRS on which the surface treatment is performed is hereinafter referred as the first region SDP and the remaining part of the carrier substrate CRS on which the surface treatment is not performed is hereinafter referred as the second region. When a mother substrate 110 is laid on the carrier substrate CRS that includes the part having a surface treated, the two substrates CRS and 110 adhere well to each other over the second region because of the static electricity formed between the carrier substrate CRS and the mother substrate 110 over the second region. On the other hand, the carrier substrate CRS and the mother substrate 110 do not adhere well over the first region SDP due to the surface treatment performed on the first region.

The carrier substrate CRS may be made of glass in a bare state, other glass, metal, and the like.

The mother substrate 110 may be cleaned before the mother substrate 110 is placed on the carrier substrate CRS.

A thickness of the mother substrate 110 may be about 0.1 mm or less, and a thickness of the carrier substrate CRS may be four to ten times the thickness of the mother substrate 110 (i.e., about 0.4 to about 1.0 mm). In some cases, the thickness of the carrier substrate CRS may be about 0.5 to about 0.7 mm.

A length and a width of the carrier substrate CRS may be changed in various ways according to a size of the supported mother substrate 110.

The first region SDP, in an exemplary embodiment, may be formed at a corner of the carrier substrate CRS, which may be shaped as a quadrangle, such that the mother substrate 110 overlaps the carrier substrate CRS at the first region. In FIG. 1, the first region SDP is formed at one corner among the four corners of the quadrangle, but the first region SDP may be formed at two or more corners. In other exemplary embodiments, the first region SDP need not be formed at any corner.

The step of performing the surface treatment on the carrier substrate CRS includes a step of increasing surface roughness of the first region SDP. In order to increase the surface roughness of the first region SDP, a thin film including an oxide or a silicon compound may be selectively deposited on the first region SDP. For example, the thin film may be formed by a sputtering method or a pulse laser deposition method. Moreover, the invention is not limited to methods of increasing the roughness that involve the deposition of a thin film on the first region SDP. For example, the surface roughness can be formed directly on the surface of the CRS substrate without depositing an additional thin film, such as by using a laser, sandpaper, etc.

Here, the first region SDP may be formed to have the surface roughness of approximately 5 nm or more. For example, according to experiments, when a layer of aluminum-doped zinc oxide of 500 Å or more was deposited on the first region SDP, the root mean square roughness of the layer was 5 nm or more and, in this case, the adhesive force between the carrier substrate CRS and the mother substrate 110 was weakened, so that the first region SDP acted as an initial separation point. Thus, the two substrates (i.e. CRS and 110) may be easily separated.

The method of depositing the thin film including the oxide or the silicon compound has been described as one example of the surface treatment. In the following, a method of forming a self-assembled monolayer will be described as another example of the surface treatment.

In an exemplary embodiment, the step of performing the surface treatment on the carrier substrate CRS includes a step of forming a self-assembled monolayer in the first region SDP. A contact angle of the first region SDP of the carrier substrate CRS before the self-assembled monolayer is formed is around 30 degrees. However, the contact angle after the self-assembled monolayer is formed in the first region SDP may be around 100 degrees and the surface of the first region SDP may be hydrophobic.

The self-assembled monolayer refers to an organic molecular layer that self-forms on a surface with given characteristics, has certain regularity and is well-arranged. Here, the self-assembled monolayer may include at least one of octadecyltrichlorosilane (OTS), perfluoroctyltrichloro silane (FOTS), and dichlorodimethylsilane (DDMS).

In the second region of the carrier substrate CRS (i.e. where there is no self-assembled monolayer formed) strong chemical bonds are generated between the carrier substrate CRS and the mother substrate 110 during the subsequent processes of forming the thin film components of the display device. In contrast, in the first region SDP of the carrier substrate, weaker chemical bonds form between the carrier substrate and the mother substrate. Thus, the two substrates can be separated by using the first region SDP as a separation starting point, thereby avoiding a situation in which the carrier substrate CRS and the mother substrate 110 may not be separated.

FIGS. 2A, 2B, and 2C show top plan views illustrating exemplary embodiments in which the surface treated region is different from the one shown in the exemplary embodiment of FIG. 1.

Referring to FIG. 2A, in an exemplary embodiment the surface treated first region SDP may be formed in a row, or may have a stick shape, may be disposed along a region adjacent to one side of the mother substrate 110 that overlaps the carrier substrate CRS. Referring to FIG. 2B, in another exemplary embodiment the first region SDP may be formed such that the first region SDP having a long stick shape described in the exemplary embodiment of FIG. 2A is divided into multiple regions. Referring to FIG. 2C, the surface treated first region SDP is formed in a long stick shape overlapping an entire side of the mother substrate 110 where the mother substrate 110 overlaps the carrier substrate CRS. The surface treated first region SDP is not limited to the exemplary embodiments described in FIGS. 2A, 2B, and 2C, and may be manufactured such as to have various forms and locations, including combinations of those shown in FIGS. 2A, 2B, and 2C.

Figure 3:
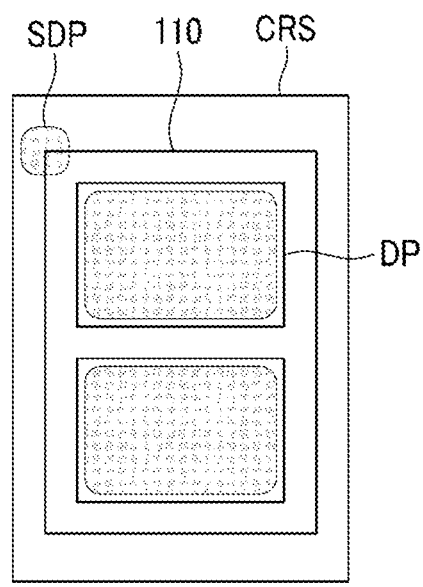
FIG. 3 is a top plan view illustrating a surface processing region of the method for manufacturing a display device according to exemplary embodiments of the present invention.

FIG. 3 is a top plan view illustrating an exemplary embodiment in which the surface treated region in the exemplary embodiment of FIG. 1 is expanded to a display region.

Referring to FIG. 3, the surface treatment may also be included in a display region DP within the mother substrate 110 in the exemplary embodiment of FIG. 1. When the surface treatment is added to the display region DP, as well as the edge, as shown in the exemplary embodiment of FIG. 3, the carrier substrate CRS and the mother substrate 110 may be more easily separated.

In the previous paragraphs, a method of performing surface treatment on a partial region SDP of the carrier substrate CRS according to an exemplary embodiment of the present invention has been described. After the surface treatment has been performed, a thin film process for forming a display device on the mother substrate 110 laid on the surface treated carrier substrate CRS may progress. Hereinafter, a process of forming a thin film will be described.

Figure 4:
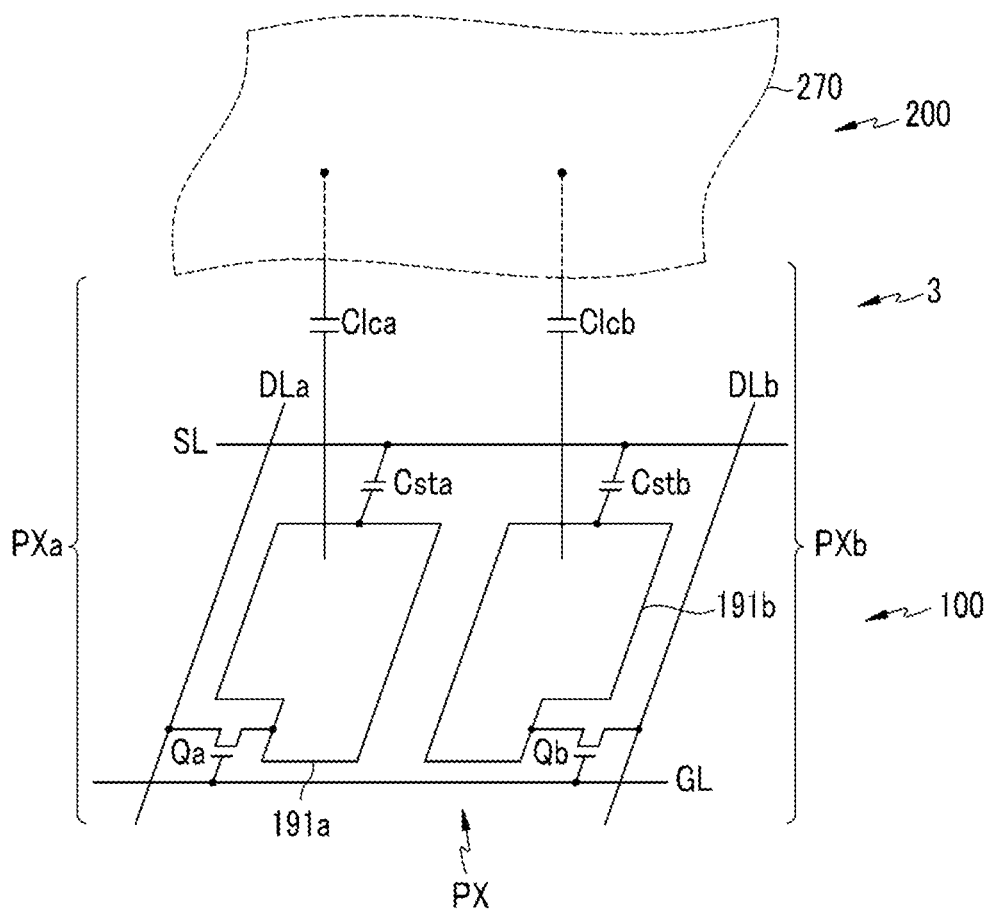
FIG. 4 is an equivalent circuit diagram of one pixel of a liquid crystal display device according to an exemplary embodiment of the present invention.

FIG. 4 is an equivalent circuit diagram of one pixel of a liquid crystal display device according to an exemplary embodiment of the present invention.

Referring to FIG. 4, the liquid crystal display device according to the exemplary embodiment of the present invention includes a thin film transistor display panel 100 and a common electrode display panel 200 facing each other, and a liquid crystal layer 3 interposed therebetween.

The liquid crystal display device includes signal lines including a plurality of gate lines GL, multiple pairs of data lines DLa and DLb, and a plurality of storage electrode lines SL, and a plurality of pixels PX connected to the signal lines.

Each pixel PX includes a pair of sub pixels PXa and PXb, and the sub pixels PXa and PXb respectively include switching elements Qa and Qb, liquid crystal capacitors Clca and Clcb, and storage capacitors Csta and Cstb.

The switching elements Qa and Qb are three-terminal elements such as thin film transistors, and the like, included in the lower display panel 100, and control terminals thereof are connected to a gate line GL, input terminals thereof are connected with the data lines DLa and DLb, and output terminals thereof are connected with the liquid crystal capacitors Clca and Clcb and the storage capacitors Csta and Cstb.

The liquid crystal capacitors Clca and Clcb are formed by using sub pixel electrodes 191a and 191b and a common electrode 270 as two terminals and a part of a liquid crystal layer 3 between the two terminals as a dielectric.

The storage electrode line SL and the sub pixel electrodes 191a and 191b included in the lower display panel 100 overlap with the dielectric interposed therebetween, so that the storage capacitors Csta and Cstb assisting the liquid crystal capacitors Clca and Clcb are formed, and a predetermined voltage, such as a common voltage Vcom, is applied to the storage electrode line SL.

Voltages charged in the two liquid crystal capacitors Clca and Clcb may be set to be slightly different. For example, a data voltage applied to the liquid crystal capacitor Clca is set to be always lower or higher than a data voltage applied to the other adjacent liquid crystal capacitor Clcb. Accordingly, if the voltages of the two liquid crystal capacitors Clca and Clcb are appropriately adjusted, an image viewed from a side may approximate to an image viewed from a front side, thereby improving side visibility of the liquid crystal display device.

Figure 5:
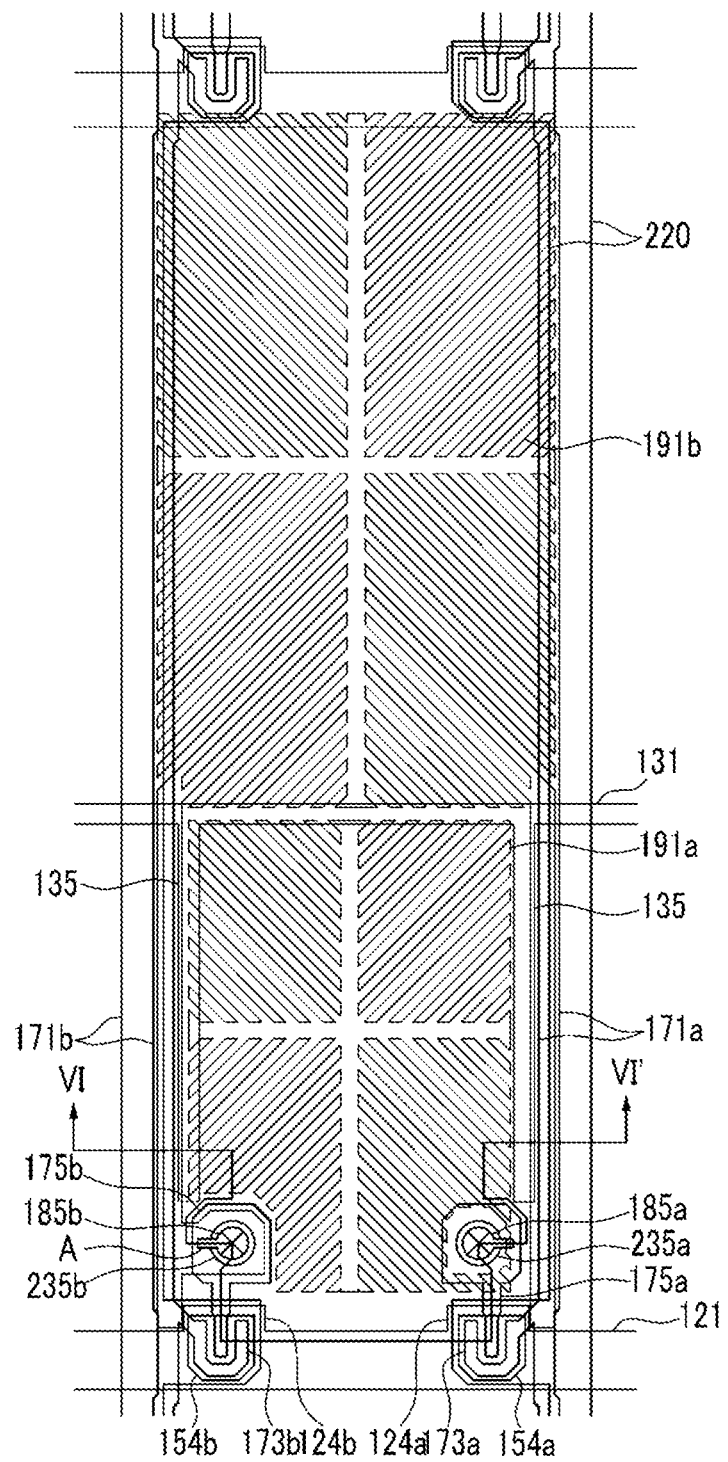
FIG. 5 is an arrangement diagram of a liquid crystal display device according to another exemplary embodiment of the present invention.
Figure 6:
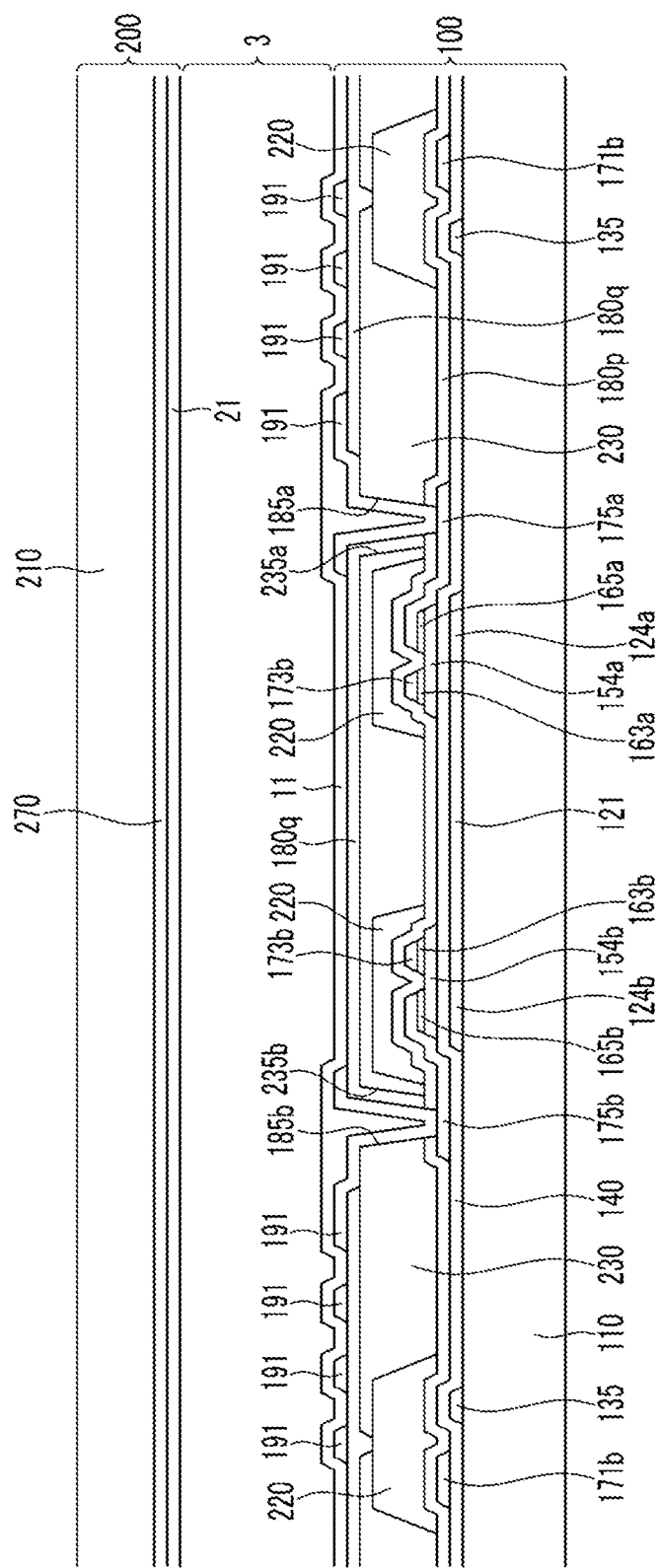
FIG. 6 is a cross-sectional view taken along line VI-VI' of FIG. 5.

FIG. 5 is an arrangement diagram of a liquid crystal display device according to another exemplary embodiment of the present invention. FIG. 6 is a cross-sectional view taken along line VI-VI' of FIG. 5.

Referring to FIGS. 5 and 6, the liquid crystal display device according to the exemplary embodiment of the present invention includes the lower display panel 100 and the upper display panel 200 facing each other, and the liquid crystal layer 3 interposed therebetween.

First, the lower display panel 100 will be described.

A plurality of gate lines 121 and a plurality of storage electrode lines 131 and 135 are formed on the mother substrate 110.

The gate line 121 transmits a gate signal and mainly extends in a horizontal direction. Each gate line 121 includes a plurality of first and second gate electrodes 124a and 124b protruding upwardly.

The storage electrode line includes a stem line 131 substantially extending in parallel to the gate line 121 and a plurality of storage electrodes 135 extending from the stem line 131.

A shape of an arrangement of the storage electrode lines 131 and 135 may be modified into various forms.

A gate insulating layer 140 is formed on the gate line 121 and the storage electrode lines 131 and 135, and a plurality of semiconductors 154a and 154b made of amorphous or crystalline silicon and the like are formed on the gate insulating layer 140.

Multiple pairs of ohmic contact members 163a/165a and 163b/165b are formed on the semiconductors 154a and 154b, respectively, and the ohmic contact members 163a/b and 165a/b may be made of a material, such as silicide or n+ hydrogenated amorphous silicon, in which n-type impurity is doped in high concentration.

Multiple pairs of data lines 171a and 171b and multiple pairs of first and second drain electrodes 175a and 175b are formed on the ohmic contact member 163a/165a and 163b/165b and the gate insulating layer 140.

The data lines 171a and 171b transmit data signals, and mainly extend in the vertical direction to cross the gate line 121 and the stem line 131 of the storage electrode line. The data lines 171a and 171b include first and second source electrodes 173a and 173b extending toward the first and second gate electrodes 124a and 124b to be bent in a U-shape, and the first and second source electrodes 173a and 173b face the first and second drain electrodes 175a and 175b based on the first and second gate electrodes 124a and 124b.

Each of the first and second drain electrodes 175a and 175b extends upwardly from one end partially surrounded by each of the first and second source electrodes 173a and 173b, and the other end may have a large area for a contact with another layer.

However, the shape and the arrangement of the data lines 171a and 171b including the first and second drain electrodes 175a and 175b may be modified into various forms.

The first and second gate electrodes 124a and 124b, the first and second source electrodes 173a and 173b, and the first and second drain electrodes 175a and 175b form first and second thin film transistors (TFT) Qa and Qb together with the first and second semiconductors 154a and 154b, and channels of the first and second thin film transistor Qa and Qb are formed in the portions of the first and second semiconductors 154a and 154b disposed between the first and second source electrodes 173a and 173b and the first and second drain electrodes 175a and 175b.

The ohmic contact members 163a, 165a, 163b, and 165b exists only between the semiconductors 154a and 154b and the data lines 171a and 171b and the drain electrodes 175a and 175b, and reduce contact resistance therebetween. Portions of the semiconductors 154a and 154b between the source electrodes 173a and 173b and the drain electrodes 175a and 175b may be exposed.

A lower passivation layer 180p made of silicon nitride or silicon oxide is formed on the data lines 171a and 171b, the drain electrodes 175a and 175b, and the exposed portions of the semiconductors 154a and 154b.

Light blocking members 220 separated at a predetermined interval are formed on the lower passivation layer 180p. The light blocking member 220 may include a straight portion elongatedly formed in a vertical direction and a quadrangular portion corresponding to the thin film transistor, and prevents light leakage.

A plurality of color filters 230 is formed on the lower passivation layer 180p and the light blocking members 220. The color filters 230 mostly exist inside the regions surrounded by the light blocking members 220. The color filter 230 includes a plurality of openings 235a and 235b positioned on the first and second drain electrodes 175a and 175b. The color filter 230 may be, for instance, a red, green, or blue color filter.

Here, the lower passivation layer 180p may prevent pigment of the color filter 230 from flowing in the exposed portions of the semiconductors 154a and 154b.

An upper passivation layer 180q is formed above the light blocking member 220 and the color filter 230. The upper passivation layer 180q may be made of an inorganic insulating material, such as silicon nitride or silicon oxide, protecting the color filter 230 and preventing defects, such as an afterimage, that may occur when driving the display.

The light blocking member 220 may be positioned on the upper display panel 200 instead of the lower display panel 100.

A plurality of contact holes 185a and 185b through which the first and second drain electrodes 175a and 175b are respectively exposed are formed in the upper passivation layer 180q and the lower passivation layer 180p.

A plurality of pixel electrodes 191 are formed on the upper passivation layer 180q, and the aforementioned color filter 230 may elongatedly extend along a row of the pixel electrodes 191. Further, a branch line 135 of the storage electrode line 131 is positioned between the pixel electrode 191 and the data lines 171a and 171b.

The pixel electrode 191 may be made of a transparent conductive material, such as ITO or IZO, or a reflective metal, such as aluminum, silver, chrome, or an alloy thereof. Each pixel electrode 191 may include the first and second sub pixel electrodes 191a and 191b separated from each other.

The first and second sub pixel electrodes 191a and 191b are physically and electrically connected with the first and second drain electrodes 175a and 175b through the contact holes 185a and 185b, and receive the data voltages from the first and second drain electrodes 175a and 175b.

An alignment layer 11 may be formed on the pixel electrodes 191.

Next, the upper display panel 200 will be described.

The upper display panel 200 includes the common electrode 270 formed on the transparent insulation substrate 210, and the alignment layer 21 is formed on the common electrode 270.

The respective alignment layers 11 and 21 may be vertical alignment layers.

A polarizer (not illustrated) may be included at external surfaces of the lower display panel 100 and the upper display panel 200.

The liquid crystal layer 3 is interposed between the lower display panel 100 and the upper display panel 200. The liquid crystal layer 3 may have negative dielectric anisotropy.

The exemplary embodiments of the present invention have been described in the context of a liquid crystal display devices. However the invention is not limited thereto, the exemplary embodiments of the present invention may also be applied to an organic light emitting display device and other display devices including the process of forming the thin film.

As described above, when the process of forming the thin film on the mother substrate 110 laid on the carrier substrate CRS is completed, strong bonds may be generated between the carrier substrate CRS and the mother substrate 110 over the second region (i.e. the region at the interface between the carrier substrate CRS and the mother substrate 110 that has not been surface treated) by anodic bonding or fusion bonding. In contrast, in the first region SDP that has been treated the bonding between the two substrates is weaker. Accordingly, the carrier substrate CRS and the mother substrate 110 may not be easily separated over the second region. The generation of bonds occurs because the process of forming the thin film may progress at a high temperatures of approximately 200° C. or higher and is performed in the presence of an electric field.

Anodic bonding may occur when sodium ions are generated at a high temperature while an electric field is applied to the interface between two glass substrates. An electrostatic force may be generated at an interface between the two glass substrates, thereby causing inter-diffusion of the sodium ions and the formation of covalent bonds. In the exemplary embodiments of the present invention, bonding may occur at the interface between the glass formed mother substrate 110 and the glass formed carrier substrate CRS. The fusion bonding is a phenomenon in which a Van der Vaals force and hydrogen bonds form at the interface between two glass substrates that are brought in contact with each other over the interface. Fusion bonding may occur even when the glass has no impurities, has surface roughness of 5 nm or less, is in a hydrophilic state, and at a high temperature.

However, according to the exemplary embodiments of the present invention, since the surface treated first region SDP of the carrier substrate CRS is formed before the process of forming the thin film, the carrier substrate CRS and the mother substrate 110 may be separated by using the first region SDP as an initial separation point to the remaining regions. Hereinafter, referring to FIG. 7, a process of separating the carrier substrate CRS and the mother substrate 110 after the process of forming the thin film will be described.

FIG. 7 is a top plan view schematically illustrating a step of separating the two substrates in the method of manufacturing the display device according to exemplary embodiments of the present invention.

Referring to FIG. 7, the surface treated first region SDP of the carrier substrate CRS is not well attached to the mother substrate 110. A substance, such as oil, having excellent spreadability and the like, may be dropped on the first region SDP. The oil dropped on the first region SDP permeates through the remaining regions, outside the first region SDP, by osmotic pressure. In this case, a thin bar 500, which may be formed of, for example, ceramic may be used so as to separate the carrier substrate CRS and the mother substrate 110. The carrier substrate CRS and the mother substrate 110 may be physically separated by moving the bar 500 in a direction of an arrow indicated in FIG. 7 from the first region SDP serving as the initial separation point.

Instead of discarding the separated carrier substrate CRS, the separated carrier substrate CRS may be recycled and used for the process of forming the thin film on another mother substrate.

Above, it was explained that the carrier substrate CRS is surface treated, but the mother substrate 110 may be surface treated instead of the carrier substrate CRS. At this time, a surface of the mother substrate 110 having a surface treated region faces to the carrier substrate CRS.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a display device, comprising:
    surface treating a first region on a first surface of a carrier substrate while leaving a second region of the carrier substrate untreated;

coupling a mother substrate with the carrier substrate by static electricity existing in the second region;
forming a thin film on the mother substrate;
disposing an oil in the first region; and
separating the carrier substrate and the mother substrate by using the first region as an initial separation point,
wherein the second region is not surface treated and is disposed at an interface between the carrier substrate and the mother substrate.

2. The method of claim 1, wherein an adhesive force between the carrier substrate and the mother substrate at the first region is less than an adhesive force between the carrier substrate and the mother substrate at the second region.

3. The method of claim 2, wherein forming the thin film is performed at a temperature of about 200° C. or higher.

4. The method of claim 3, wherein a surface roughness of the first region is different from a surface roughness of the second region.

5. The method of claim 4, wherein the first region is formed by depositing a thin film comprising an oxide or a silicon compound.

6. The method of claim 5, wherein the thin film comprises an oxide and the oxide comprises at least one of indium, tin, and zinc.

7. The method of claim 4, wherein the surface roughness of the first region is about 5 nm or larger.

8. The method of claim 3, wherein the first region comprises a self-assembled monolayer.

9. The method of claim 8, wherein the first region comprising the self-assembled monolayer is hydrophobic.

10. The method of claim 9, wherein the self-assembled monolayer comprises at least one of octadecyltrichlorosilane (OTS), perfluoroctyltrichloro silane (FOTS), and Dichlorodimethylsilane (DDMS).

11. The method of claim 1, wherein separating the carrier substrate and the mother substrate comprises using a stick-shaped bar.

12. The method of claim 1, further comprising:
after separating the carrier substrate and the mother substrate, disposing another mother substrate on the carrier substrate;
forming a thin film on the another mother substrate; and
separating the carrier substrate and the another mother substrate.

13. The method of claim 1, wherein the first region overlaps a corner of the mother substrate.

14. The method of claim 1, wherein the first region is disposed on the carrier substrate so as to be arranged along at least one side of the mother substrate.

15. The method of claim 1, wherein the first region comprises a portion overlapping a display region of the mother substrate.

16. A method of manufacturing a display device, comprising:
coupling a first substrate and a second substrate together, the first substrate comprising a first surface comprising a first region and a second region disposed at an interface between the first substrate and the second substrate;
forming at least one element on the second substrate;
disposing an oil in the first region; and
separating the first substrate and the second substrate, the first region being an initial separation point,
wherein:
only the first region comprises a surface treated region;
an adhesive force between the first and second substrates at the first region is less than an adhesive force between the first and second substrates at the second region; and
the first substrate and the second substrate are coupled by static electricity existing in the second region.

* * * * *